United States Patent
Hsueh et al.

(10) Patent No.: US 7,032,194 B1
(45) Date of Patent: Apr. 18, 2006

(54) LAYOUT CORRECTION ALGORITHMS FOR REMOVING STRESS AND OTHER PHYSICAL EFFECT INDUCED PROCESS DEVIATION

(75) Inventors: Shih-Cheng Hsueh, Fremont, CA (US); Xiao-Jie Yuan, Cupertino, CA (US); Daniel Gitlin, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 291 days.

(21) Appl. No.: 10/369,888

(22) Filed: Feb. 19, 2003

(51) Int. Cl.
*G06F 17/50* (2006.01)
(52) U.S. Cl. .................................. 716/4; 716/2; 716/19
(58) Field of Classification Search .................... 716/8, 716/11, 18–19, 2, 4, 5
See application file for complete search history.

(56) References Cited

U.S. PATENT DOCUMENTS

| | | | |
|---|---|---|---|
| 6,526,547 B1* | 2/2003 | Breiner et al. .................. | 716/4 |
| 2002/0083399 A1* | 6/2002 | Chatterjee et al. .............. | 716/1 |
| 2003/0148584 A1* | 8/2003 | Roberds et al. ............. | 438/285 |
| 2003/0173588 A1* | 9/2003 | Bianchi ....................... | 257/200 |
| 2004/0111693 A1* | 6/2004 | Lin et al. ....................... | 716/19 |

OTHER PUBLICATIONS

Chung, S.S., et al., "A new physical and quantitative width dependent hot carrier model for shallow-trench-isolated devices", Apr. 2001, IEEE. pp. 419-424.*
En, W.G., et al., "Reduction of STI/Active stress on 0.18 micro meter SOI devices through modification of STI process", IEEE, Oct. 2001, pp. 85-86.*

* cited by examiner

*Primary Examiner*—Stacy A. Whitmore
(74) *Attorney, Agent, or Firm*—John Kubodera; Justin Liu

(57) ABSTRACT

A method for dealing with process specific physical effects applies dimensional modifications to an IC layout to compensate for performance variations caused by the physical effects. Because the dimensional modifications harmonize the performance of the actual IC with the performance of the IC model, time-consuming re-verification operations are not required. Current drive variations caused by shallow trench isolation (STI) stress can be compensated for by adjusting the gate dimensions of the affected transistors to increase or decrease current drive as necessary. Such physical effect compensation can be applied before, after, or even concurrently with optical proximity correction (OPC). The dimensional modifications for physical effect compensation can also be incorporated into an OPC engine.

28 Claims, 7 Drawing Sheets

US 7,032,194 B1

LAYOUT CORRECTION ALGORITHMS FOR REMOVING STRESS AND OTHER PHYSICAL EFFECT INDUCED PROCESS DEVIATION

FIELD OF THE INVENTION

The invention relates generally to integrated circuit manufacturing, and more specifically to methods for maintaining consistency between simulated and actual device performance.

BACKGROUND OF THE INVENTION

Integrated circuit (IC) designs typically undergo extensive simulation before being implemented in silicon. These simulations are generally based on a defined set of parameters that are intended to provide a reasonable characterization of the actual behavior of the devices in the final IC. Unfortunately, as IC dimensions continue to shrink, physical effects not captured by traditional simulation parameters can significantly affect IC performance.

For example, for sub-0.25 μm processes, shallow trench isolation (STI) has begun to replace the traditional local oxidation of silicon (LOCOS) structures used to separate transistors. FIG. 1 shows a metal-oxide-semiconductor (MOS) transistor 100 that includes a source 141 and a drain 142 formed in an active region 120 in a substrate 190, a gate oxide 150 formed over a channel region 130 between source 141 and drain 142, and a gate 160 formed over gate oxide 150. Compact STI oxide structures 111 and 112 isolate transistor 100 from neighboring devices.

STI improves over LOCOS by providing more efficient and more controllable isolation structures that allow substantially greater transistor packing density. However, the nature of the STI formation processes can create localized stress in the diffusion region between STI structures. This particular physical effect, sometimes referred to as "STI stress," can significantly impact the current drive of a transistor (i.e., the current carrying characteristics of the transistor, such as saturation current) that is isolated by STI structures. STI stress is a highly complex physical effect that can either increase or decrease carrier mobility in the active region of a transistor, thereby increasing or decreasing, respectively, the current drive of the transistor.

FIG. 2 shows an IC layout 200 that includes transistors 201, 202, and 203. Transistor 201 includes an active region 221 and an overlying gate 261 that defines a channel region 231 in active region 221. Transistor 201 is isolated by STI structures 211 and 212. Transistor 202 includes an active region 222 and an overlying gate 262 that defines a channel region 232 in active region 222. Transistor 202 is isolated by STI structures 212 and 213. Finally, transistor 203 includes an active region 223 and an overlying gate 263 that defines a channel region 233 in active region 223. Transistor 203 is isolated by STI structures 213 and 214.

Typically, the only physical characteristics used to model the behavior of a transistor are channel length and channel width, which, in conjunction with various process parameters (dopant level, etc.) (also called a process recipe), are used in simulations to calculate the expected current drive for that transistor. For example, channel regions 231, 232, and 233 of transistors 201, 202, and 203, respectively, have channel lengths L1, L2, and L3, respectively, and channel widths W1, W2, and W3, respectively. When channel lengths L1, L2, and L3 are all the same, and channel widths W1, W2, and W3 are all the same, transistors 201, 202, and 203 will be modeled for simulation as having equal current drives.

Unfortunately, STI stresses can degrade the accuracy of such simulations. STI stress is related not to the dimensions of the channel itself, but rather to the "channel spacing" of the transistor, i.e., the spacing between the channel (or gate) of the transistor and the adjacent STI structures. Note that since the channel (and gate) of a transistor is typically centered between STI structures, the channel spacing of a transistor can be taken with reference to either adjacent STI structure. For example, in FIG. 2, channel spacings D1, D2, and D3 determine the degree of STI stress present in transistors 201, 202, and 203, respectively. Therefore, even though they have similar channel dimensions, transistors 201, 202, and 203 can have significantly different current drives due to STI stress variations.

The precise effects of physical effects such as STI stress are closely tied to the particular process recipe being used. Therefore, any efforts to correct or compensate for physical effects must be tailored to a specific process. However, because process development is typically performed in parallel with IC design to minimize time to production, incorporating physical effects into early simulations is generally not possible. The process details needed to determine the exact nature of the physical effects are not yet known at the stage of early simulation. Consequently, conventional physical effect compensation techniques can be extremely expensive and time consuming.

For example, FIG. 3 shows a flow diagram of a conventional IC design flow (along with a concurrent process development flow). The IC design flow begins with a logic design step 310, in which an IC specification is defined and an initial functional design F_initial (i.e., a schematic or hardware description language (HDL) design) based on that IC specification is created. Concurrently, the process recipe (s) for production of the final ICs are defined and refined in a time-consuming process development step 390. Note the relative positions of process development step 390 and IC design flow steps 310–380 does not indicate that the steps necessarily begin and end at the same time, but rather merely indicates that the IC design flow and the process development flow progress along parallel tracks.

Once initial functional design F_initial is defined, it is modeled and tested in a logic verification step 320 to determine whether the functional design is correct. The operation of the functional design is simulated by applying a range of inputs to the functional design, and comparing the resulting outputs with a set of expected outputs. The functional design can then be adjusted in response to any unexpected output discrepancies, thereby creating a final functional design F_final.

The more realistically the behavior of the functional design can be simulated in logic verification step 320, the less likely expensive downstream redesigns will be required. Therefore, during logic verification step 320, electrical rules (e.g., propagation delays, loading impedance) generated by a foundry as part of process development step 390 are often incorporated into the functional design to improve the accuracy of the simulation efforts. These electrical rules typically relate to basic process properties (e.g., interconnect resistance, parasitic capacitance) and are therefore available relatively early in the process development flow.

Unfortunately, details regarding physical effect characteristics are generally not available until much later in the process development flow. Physical effects are typically much more sensitive than basic electrical rules to small process adjustments, and therefore are not fully characterized until the process itself is relatively mature. Therefore, it is not feasible to incorporate physical effects into the logic simulation performed in logic verification step 320. Furthermore, even if the physical effect characteristics were available at this point, incorporating such details into the logic simulations might still be problematic, since the complex nature of such effects would result in a substantial increase the complexity of the models and the associated simulation runtimes.

Once the functional design is complete, the physical layout of the IC is generated in a place and route step 330. Using design rules Rdesign from process development step 390 that provide geometrical constraints and requirements for the placement of structures within the IC, an initial layout L_initial is created. Initial layout L_initial is a physical representation of the IC design. The accuracy and process compatibility of this layout is checked in a layout verification step 340, which can comprise design rule checking (DRC) and electrical rule checking (ERC) using design rules Rdesign and electrical rules Relec, respectively. Layout verification step 340 can also include a layout versus schematic (LVS) test to ensure that the physical layout matches the functional logic design (F_final). Over the course of layout verification step 340, any layout problems (e.g., rule violations, layout discrepancies) are corrected to generate a final design layout L_final, which is subsequently output in a tapeout step 350 as a set of basic layout data files D_layout.

Next, in an optical proximity correction (OPC) step 360, OPC features are added to the basic layout defined by layout data files D_layout to generate a corrected mask layout set M_layout. The OPC features, such as hammerheads, serifs, and assist features, are designed to "precompensate" for distortions that are produced by lithography and etch process steps, thereby improving the accuracy with which the design layout is implemented in the actual IC. OPC features are therefore based in large part on process characteristics Pchar determined during process development step 390.

A lithography mask set M_set is then created from corrected mask layout set M_layout in a mask production step 370. Mask set M_set is then used in a bench testing step 380 to produce test articles of the final IC. If those test articles satisfy the original IC specification, IC production can commence in full. Unfortunately, physical effects that have not been dealt with up until this point can prevent the test articles from meeting the requirements of the IC specification. When such problems are discovered, conventional responses are either to tune the process or to redesign the IC in an effort to eliminate or minimize the impact of the physical effects.

If the process defined in process development step 390 can be tuned to reduce the severity of physical effects, expensive IC design changes can be avoided. However, such tuning adds an additional layer of complexity onto what is already an extremely difficult task. By imposing additional process performance requirements, the already lengthy process development period can be significantly increased. This can lead to a delay in introducing a product to the market, which can have severe impact on profitability. Furthermore, some or all of the problematic physical effects may not even be addressable by adjusting the process, in which case any such tuning efforts would be wasted. Therefore, attempting to compensate for physical effects via process tuning is a problematic approach.

Therefore, an IC redesign (indicated by the dashed line between bench testing step 380 and logic design step 310) typically provides a more reliable corrective action for physical effects than does process tuning. However, once tapeout step 350 is complete, the IC design is essentially frozen. Subsequent design changes (e.g., modifying device locations, adding delay elements) require that the time-consuming, and hence costly, simulations of logic verification step 320 and layout verification step 340 be re-run with the modified design. Therefore, redesigning the IC at this point to compensate for physical effects is also problematic.

Accordingly, it is desirable to provide a system and method for compensating for physical effects that does not introduce excessive production delays and can be incorporated into the normal IC design and process development flows.

SUMMARY OF THE INVENTION

The invention harmonizes the actual performance of an IC with its simulated performance by applying dimensional modifications to the IC layout that compensate for physical effects not incorporated into conventional IC simulation models. This "physical effect compensation" can be easily applied to an IC layout to ensure proper IC performance without the costly and time-consuming redesign, re-simulation, and/or process tuning required by conventional methods of dealing with physical effects.

For example, according to an embodiment of the invention, adjusting the gate dimensions of the affected transistors can compensate for STI stress effects. Increasing or decreasing gate length increases or decreases transistor channel length, respectively, thereby decreasing or increasing, respectively, the current drive of the transistor. Therefore, any current drive variations caused by STI stress can be counteracted by appropriate modification of the gate lengths of the affected transistors.

Because physical effect compensation does not create a need for re-simulation of the IC design, it can be performed after tapeout with little impact on overall IC design throughput. According to an embodiment of the invention, physical effect compensation can be performed at or around the same time as optical proximity correction (OPC). Since both OPC and physical effect compensation rely on detailed process characteristics that are typically available towards the end of the process development cycle, it is natural for the two operations to be performed at the same or similar times in the IC design process. According to an embodiment of the invention, physical effect compensation is performed before OPC to ensure that any dimensional modifications receive appropriate OPC treatment. However, according to another embodiment of the invention, because the dimensional modifications required by physical effect compensation are typically very small, physical effect compensation can be performed after OPC. According to another embodiment of the invention, physical effect compensation can be performed simultaneously with OPC. For example, physical effect compensation rules can be incorporated into an OPC engine, thereby allowing the OPC engine to apply both OPC rules and physical effect compensation rules.

The present invention will be more fully understood in view of the following description and drawings.

DETAILED DESCRIPTION OF THE DRAWINGS

By implementing dimensional modifications to layout elements that compensate for process-specific physical effects, the invention provides an efficient means for addressing performance variations caused by those physical effects. Because the dimensional modifications bring the performance of the final IC closer to the modeled performance, no re-simulation is required. For example, as described above, STI stress can introduce unwanted variations into the current drives of transistors, and the precise nature of those variations depends on the specific process used to produce the transistors. According to an embodiment of the invention, adjusting the gate dimensions of the affected transistors can compensate for such STI stress effects. Since the gate dimensions determine the channel dimensions of a transistor, and since the current drive of a transistor can be adjusted by adjusting its channel dimensions, any STI stress-related current drive variations can be counteracted by appropriate gate dimensional modifications.

Figure 4A:
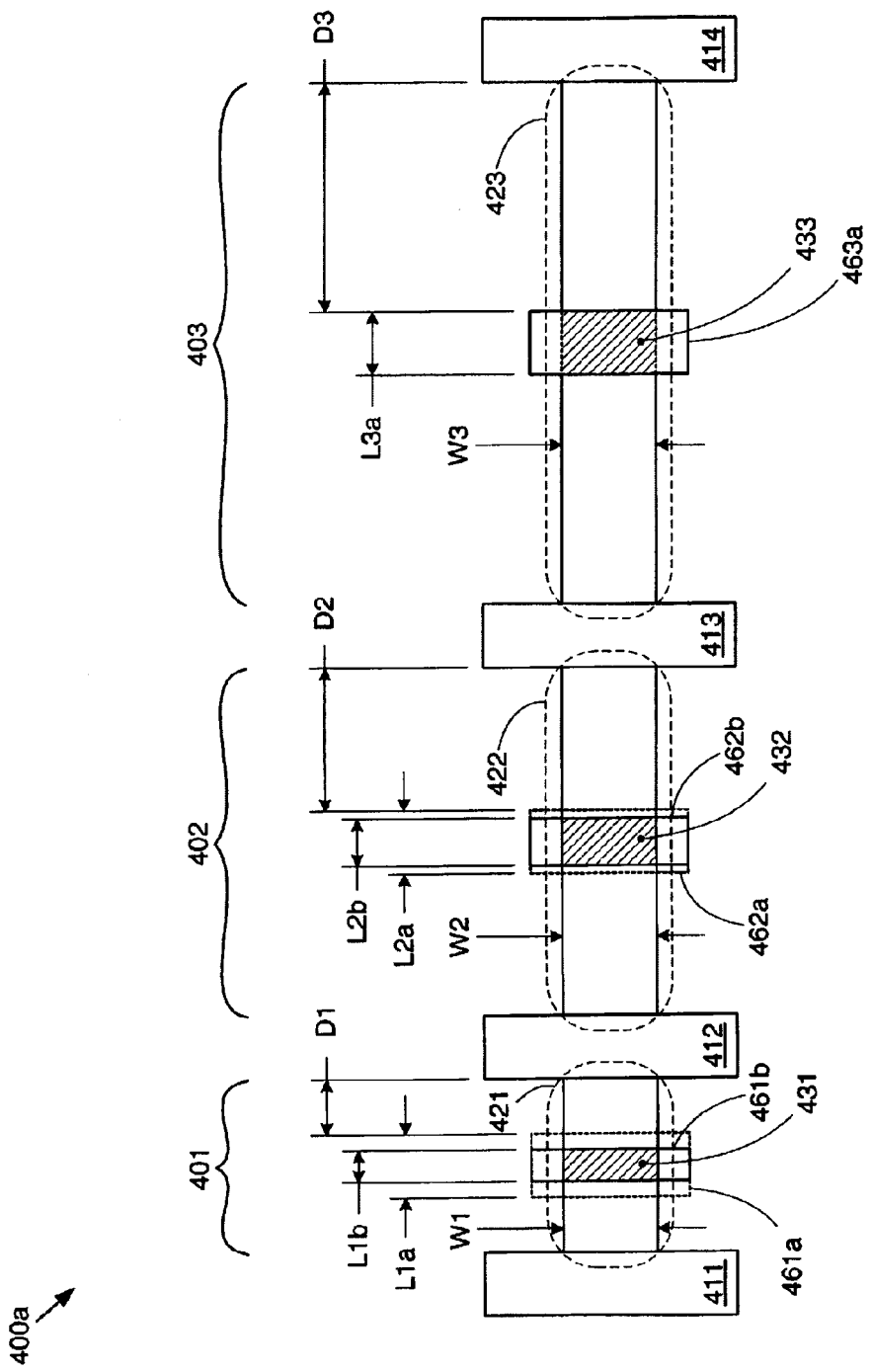
FIGS. 4a and 4b are IC layouts showing possible dimensional modifications to compensate for STI stress, according to various embodiments of the invention.

FIG. 4a shows a compensated IC layout 400a that includes dimensional modifications that can be made in response to an STI stress effect that decreases carrier mobility, in accordance with an embodiment of the invention. Compensated IC layout 400a includes transistors 401, 402, and 403. Transistor 401 includes an active region 421 and an overlying gate 461b that defines a channel region 431 in active region 421. Transistor 401 is isolated by STI structures 411 and 412. Transistor 402 includes an active region 422 and an overlying gate 462b that defines a channel region 432 in active region 422. Transistor 402 is isolated by STI structures 412 and 413. Finally, transistor 403 includes an active region 423 and an overlying gate 463a that defines a channel region 433 in active region 423. Transistor 403 is isolated by STI structures 413 and 414.

In the original (unmodified and uncompensated) IC layout from which compensated IC layout 400a was created, original gates 461a and 462a (indicated by dotted outlines) had gate lengths L1a and L2a, respectively, that are equal to a gate length L3a of gate 463a. Because channel widths W1, W2, and w3 of transistors 401, 402, and 403, respectively, are also equal, the original channel dimensions for all three transistors are equal, and all three transistors are modeled as having identical current drives. The dimensional modifications implemented in compensated IC layout 400a ensure that the actual performance of the IC matches that simulated performance. Specifically, original gates 461a and 462a were modified to produce gates 461b and 462b, respectively, having compensated gate (and therefore channel) lengths L1b and L2b, respectively. Note that this and all other figures are not to scale, with layout elements and dimensional modifications being sized or resized for clarity of explanation rather than for strict dimensional accuracy.

Because the degree of carrier mobility is determined by the amount of STI stress, which is in turn determined by channel spacing (i.e., the distance between the channel region of the transistor and the adjacent STI structures), compensated channel lengths L1b and L2b of transistors 401 and 402, respectively, are not the same, even though the original transistors had equal channel lengths. Transistor 401 had an original channel spacing D1 that was less than an original channel spacing D2 of transistor 402, so STI stresses are higher in transistor 401 than in transistor 402. Therefore, STI stress creates a greater decrease in current drive in transistor 401 that it does in transistor 402. To account for this difference, the compensated channel length L1b of transistor 401 is shorter than the compensated channel length L2b of transistor 402. Particular values for compensated channel lengths L1b and L2b can be determined from the specific STI stress characteristics of the process used to produce ICs from IC layout 400a. Meanwhile, transistor 403 is not affected by STI stress due to its large channel spacing D3, so the dimensions of channel 433 are not adjusted. In this manner, compensated IC layout 400a is configured to produce three transistors that have the same current drive, thereby ensuring that the actual performance of the final IC matches the simulated performance of the verification models used during the IC design process.

Figure 4B:
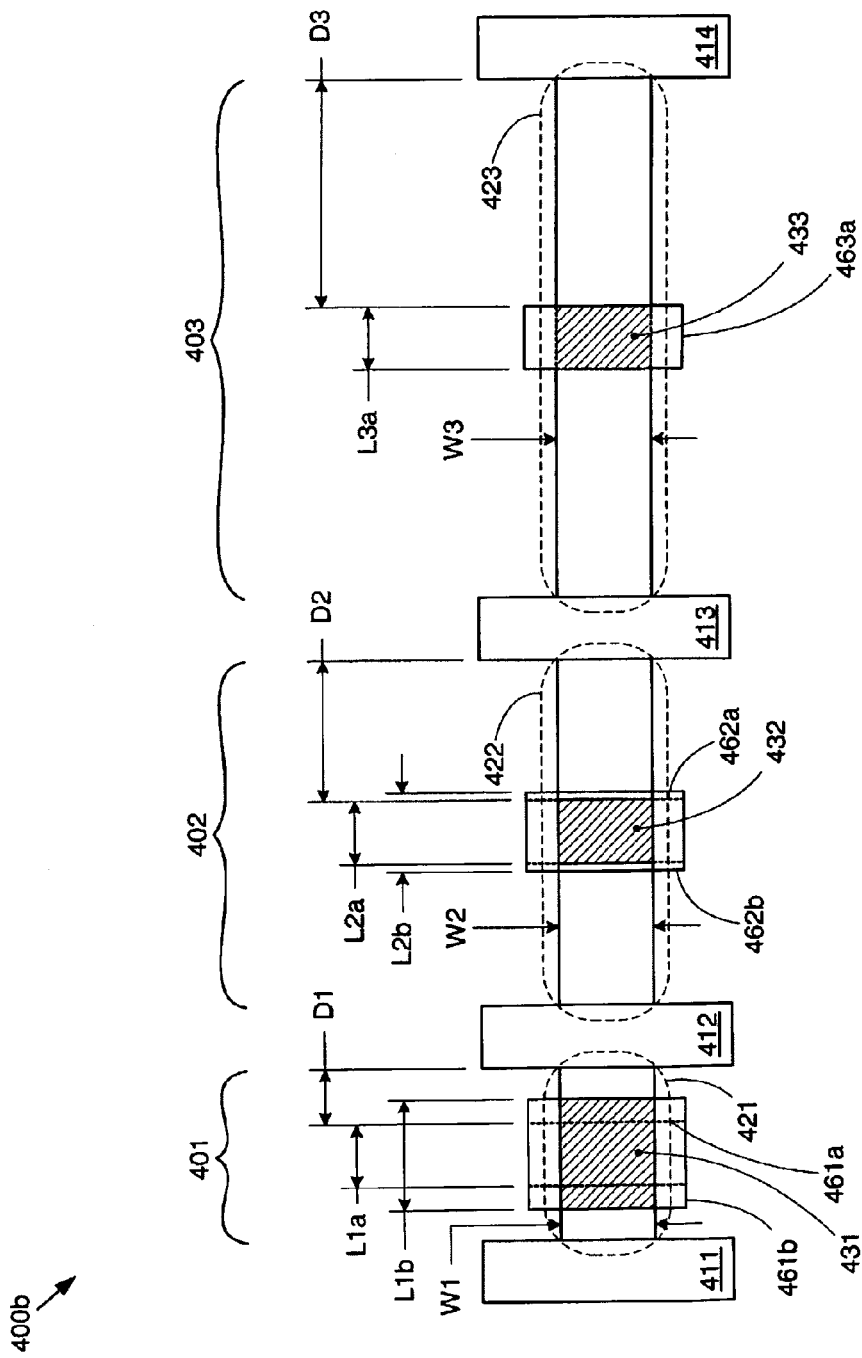

Similarly, FIG. 4b shows a compensated IC layout 400b that includes dimensional modifications that can be made in response to an STI stress effect that increases carrier mobility, in accordance with an embodiment of the invention. Compensated IC layout 400b is substantially similar to compensated IC layout 400a shown in FIG. 4a, except that since the process for compensated IC layout 400b creates an STI stress that increases carrier mobility, the dimensional modifications to compensate for STI stress must decrease current drive for devices exposed to increased STI stress. Therefore, the gate lengths of transistors 401 and 402 are increased to increase the channel lengths (and therefore decrease the current drives) of those transistors. For the same reasons as before, the STI stress within active region 421 of transistor 401 is greater than the STI stress within active region 422 of transistor 402, so the compensated length L1b of gate 461b is greater than the compensated length L2b of gate 462b, with the specific sizing of gates 461b and 462b being determined according to the particular STI stress characteristics of the applicable process. And, as with the example illustrated in FIG. 4a, no compensation is needed for transistor 403.

In general, dimensional modifications, such as those described above, that are made in response to physical effects can be efficiently incorporated into an IC design due to the "non-corrective" nature of such physical effect compensation. In other words, physical effect compensation merely implements dimensional modifications to existing layout features that make the actual IC behavior more closely resemble the simulated IC behavior, rather than making design changes such as repositioning devices, rerouting paths, or adding buffer-type elements. Therefore, by applying physical effect compensation rather than design changes, the invention eliminates the time consuming step of re-verifying (which can include re-simulating) the IC design. Furthermore, since the physical effect compensation makes use of the actual process characteristics, no additional process tuning is required, and the invention allows an IC design to be adapted with ease to many different processes.

Figure 5:
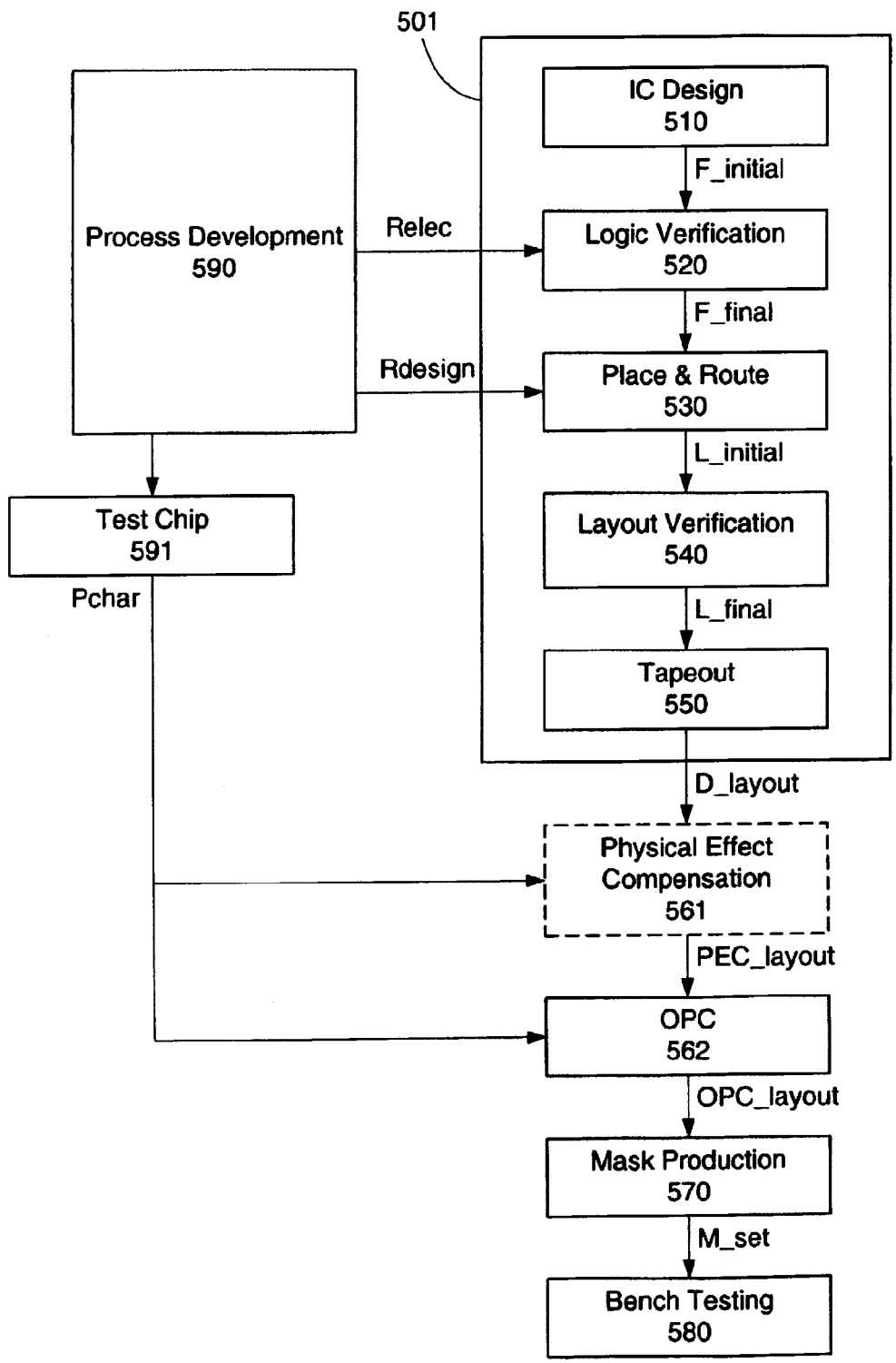
FIG. 5 is a flow diagram of an IC design flow incorporating a method for compensating for physical effects according to an embodiment of the invention.

FIG. 5 shows a flow diagram for an IC design flow, along with a concurrent process development flow, incorporating physical effect compensation in accordance with an embodiment of the invention. In a layout design step 501, a set of basic layout data files D_layout defining the basic IC layout are generated. Concurrently, process recipe(s) for IC production are defined and refined in a process development step 590. Note that although process development step 590 is positioned next to layout design step 501 for explanatory purposes, this does not indicate that the two steps begin and end at the same time. Rather, the placement merely indicates that the IC design flow and the process development flow progress along parallel tracks.

Figure 1:
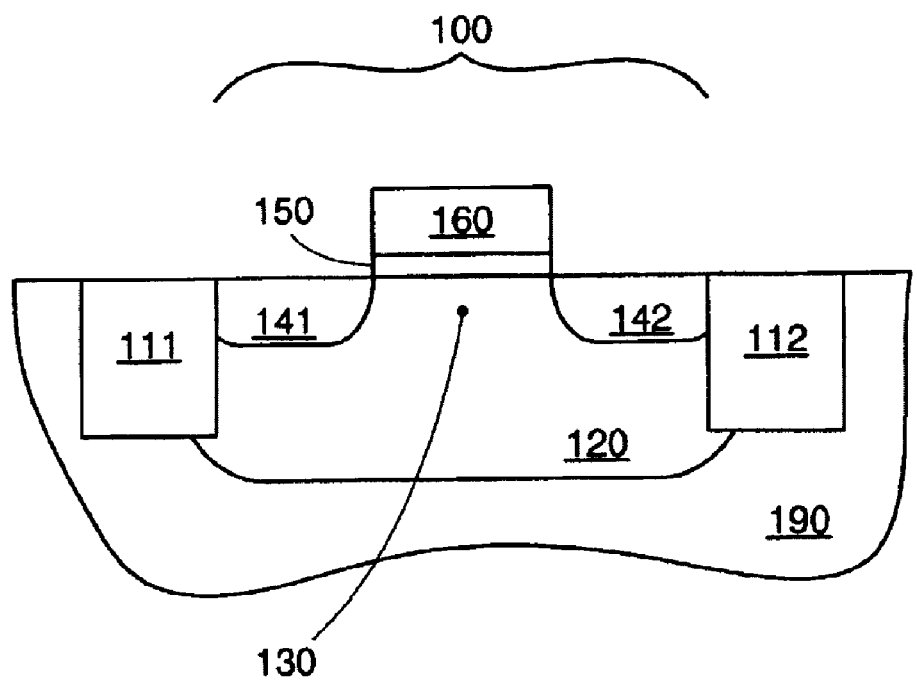
FIG. 1 shows a cross section of a transistor electrically isolated by STI structures.
Figure 2:
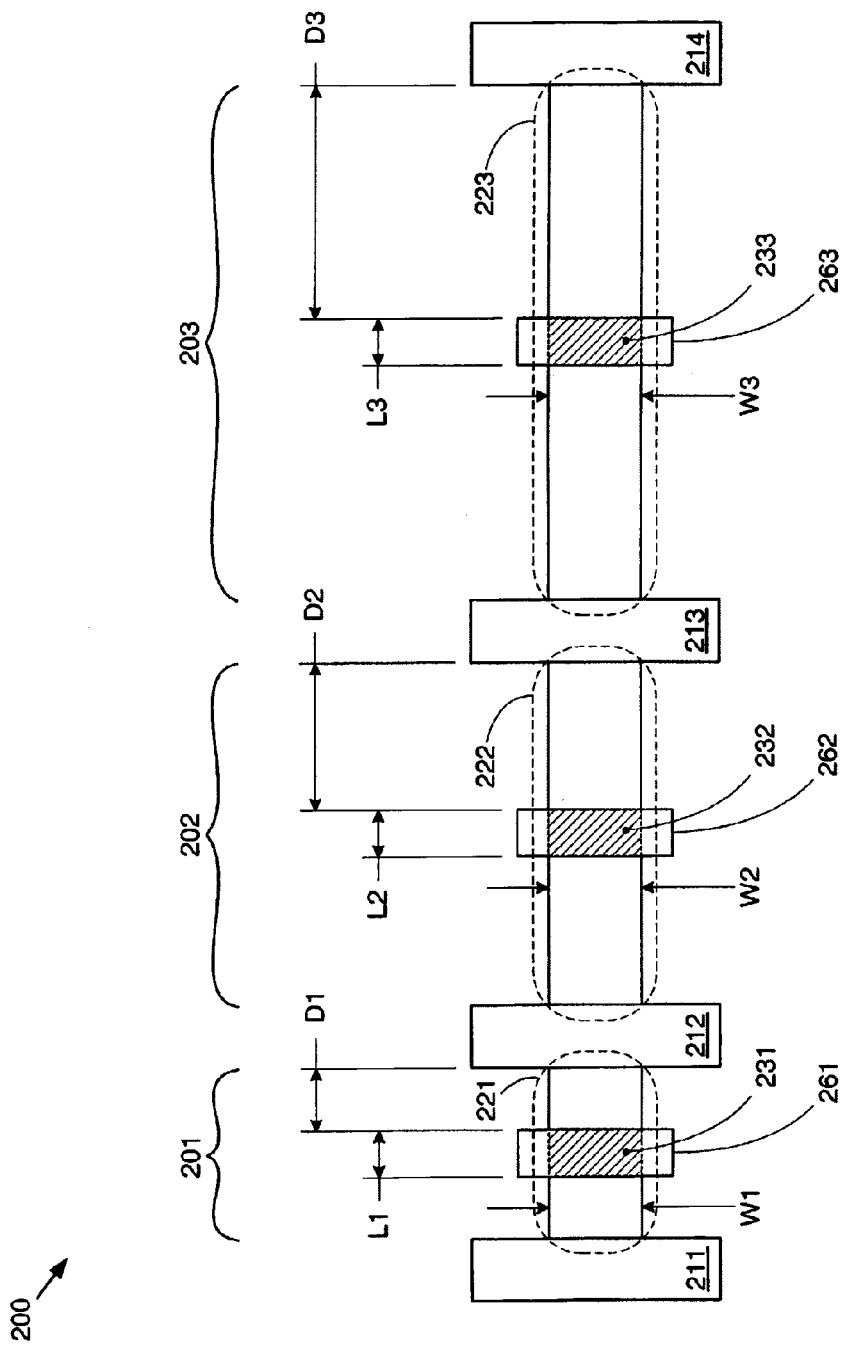
FIG. 2 shows an IC layout including transistors electrically isolated from each other by STI structures.
Figure 3:
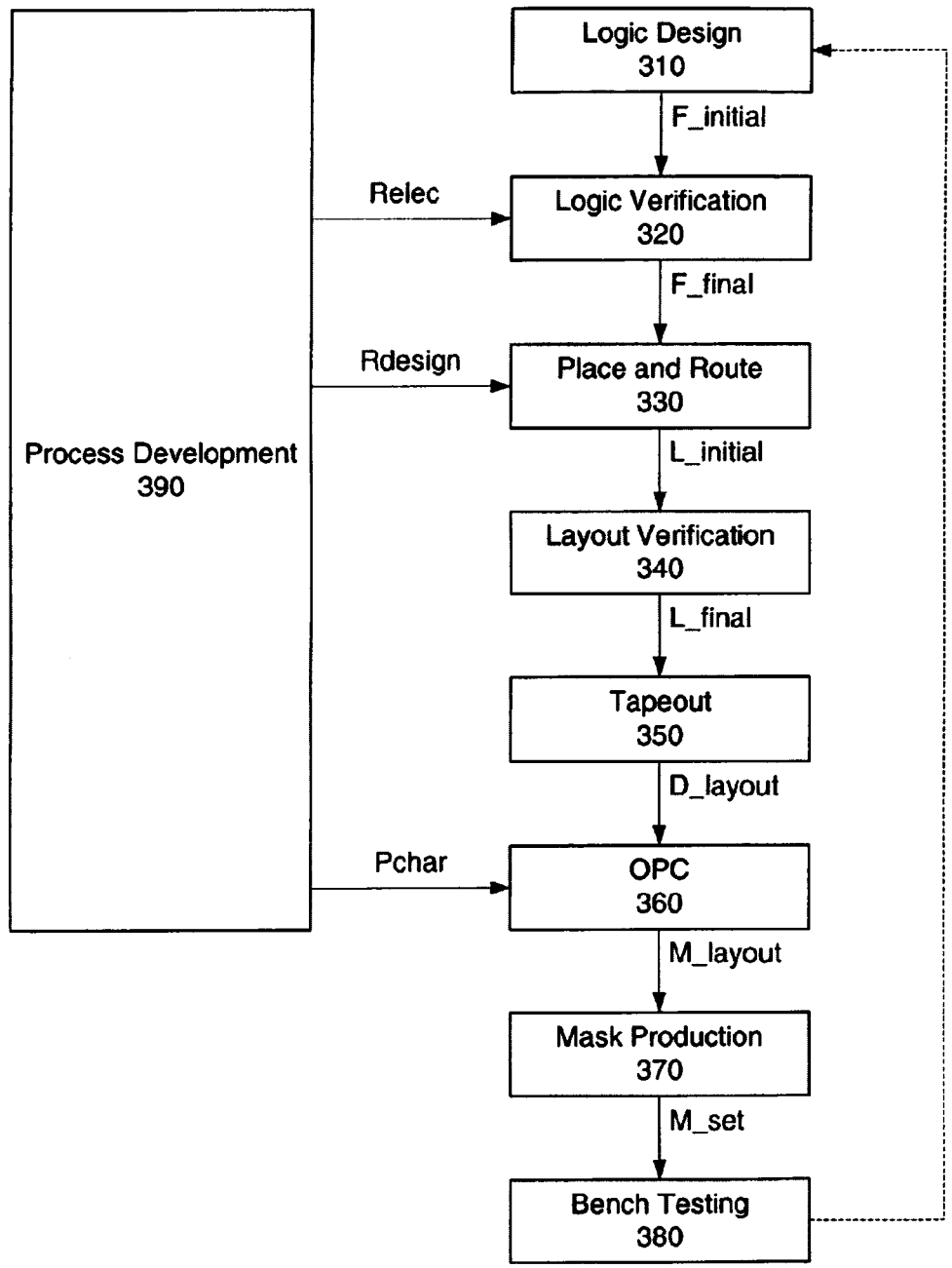
FIG. 3 is a flow diagram of a conventional IC design flow including options for reconciling actual device performance with simulation results.

Layout design step 501 can comprise any method by which IC layout data files can be generated. According to an embodiment of the invention, layout design step 501 can comprise an initial IC design step 510, a logic verification step 520, a place and route step 530, a layout verification step 540, and a tapeout step 550, which steps can substantially correspond to steps 310, 320, 330, 340, and 350, respectively, shown in FIG. 3.

Thus, in logic design step 510, an initial functional design F_initial (e.g., a schematic or hardware description language (HDL) design) can be created based upon a predetermined IC specification. Then in logic verification step 520, initial functional design F_initial can be modeled and tested to determine the validity of the logic design. According to an embodiment of the invention, electrical rules Relec, determined during process development step 590, can be incorporated into the simulation model for enhanced accuracy. Any problems uncovered by the simulation can then be corrected to generate a final functional design F_final.

An initial physical layout L_initial is generated in a place and route step 530, which can be based on predefined cell structures and design rules and/or design rules Rdesign from process development step 590. The physical layout provides dimensional and positional information as to the actual devices and structures that form the final IC. Layout checking such as design rule checking (DRC), electrical rule checking (ERC), and/or layout-versus-schematic checking (LVS) is performed in a layout verification step 540. Any detected layout problems (e.g., rule violations, layout discrepancies) are corrected to generate a final design layout L_final, which is finalized in a tapeout step 550 to generate the set of layout data files D_layout.

Once the layout data files have been taped out, a physical effect compensation step 561 is performed to adjust the layout data in response to physical effect process characteristics Pchar. These characteristics Pchar are derived during a test chip step 591 in which a test chip having a wide range of structures and configurations is produced using the final (or near-final) process. Physical effect compensation step 561 generates a compensated IC layout PEC_layout that includes dimensional modifications to layout elements that are designed to counteract physical effects (such as STI stress and well proximity effect) for a specific process. Process characteristics Pchar provide the detailed physical effect characteristics used to determine the required dimensional modifications. As noted above, these dimensional modifications are intended to align the final IC performance more closely with the original IC simulation(s), and therefore do not require any additional design testing, thereby making physical effect compensation in this manner significantly more efficient than conventional physical effect correction methods that can involve redesign or process tuning.

Once physical effect compensation is complete, an OPC step 562 is performed to ensure that the layout data will be accurately transferred to the wafer (taking into account, for example, distortions that are produced by lithography and etch process steps). The resulting corrected IC layout OPC_layout is then used to create a mask set M_set in a mask production step 570, and mask set M_set is used in a bench testing step 580 for test article validation before moving on to actual production.

Thus, physical effect compensation step 561 can be readily integrated into standard IC design processes since the dimensional modifications do not require any time-consuming modeling and verification steps. Note that while physical effect compensation step 561 is depicted as preceding OPC step 562 for explanatory purposes, physical effect compensation step 561 can take place at other points in the IC design flow (as indicated by the dashed lines around physical effect compensation step 561). For example, according to an embodiment of the invention, physical effect compensation step 561 could be performed after OPC step 562. While OPC corrections would ideally be performed on the layout data after all other dimensional modifications have been made, the dimensional modifications made to compensate for physical effects are typically very small, and therefore do not significantly alter the final layout configuration when performed after OPC.

According to another embodiment of the invention, physical effect compensation can actually be incorporated into the OPC logic (OPC engine) used to perform OPC step 562. The OPC engine is essentially a tool for detecting specific layout features and then applying OPC to those layout features. Therefore, the physical effect characteristics derived from process development step 590 can be fed into the OPC engine so that when layout features affected by those physical effects are detected, the appropriate dimensional modifications are applied. Note that while physical effect compensation behavior can be integrated into model-based OPC engine, it is generally more efficient simply to incorporate physical effect compensation rules into a rule-based OPC engine. Note also that because most OPC engines evaluate layout data on a layer-by-layer basis, a modification may be required to allow multi-layer processing (i.e., concurrent processing of multiple design layers). This is because features requiring physical effect compensation are often defined by structures from different design layers (e.g., the channel region involved in STI stress determinations is defined by both the active (diffusion) layer and the gate (poly) layer), so the physical effect compensation rules would also need to be based on data from multiple layers.

Figure 6:
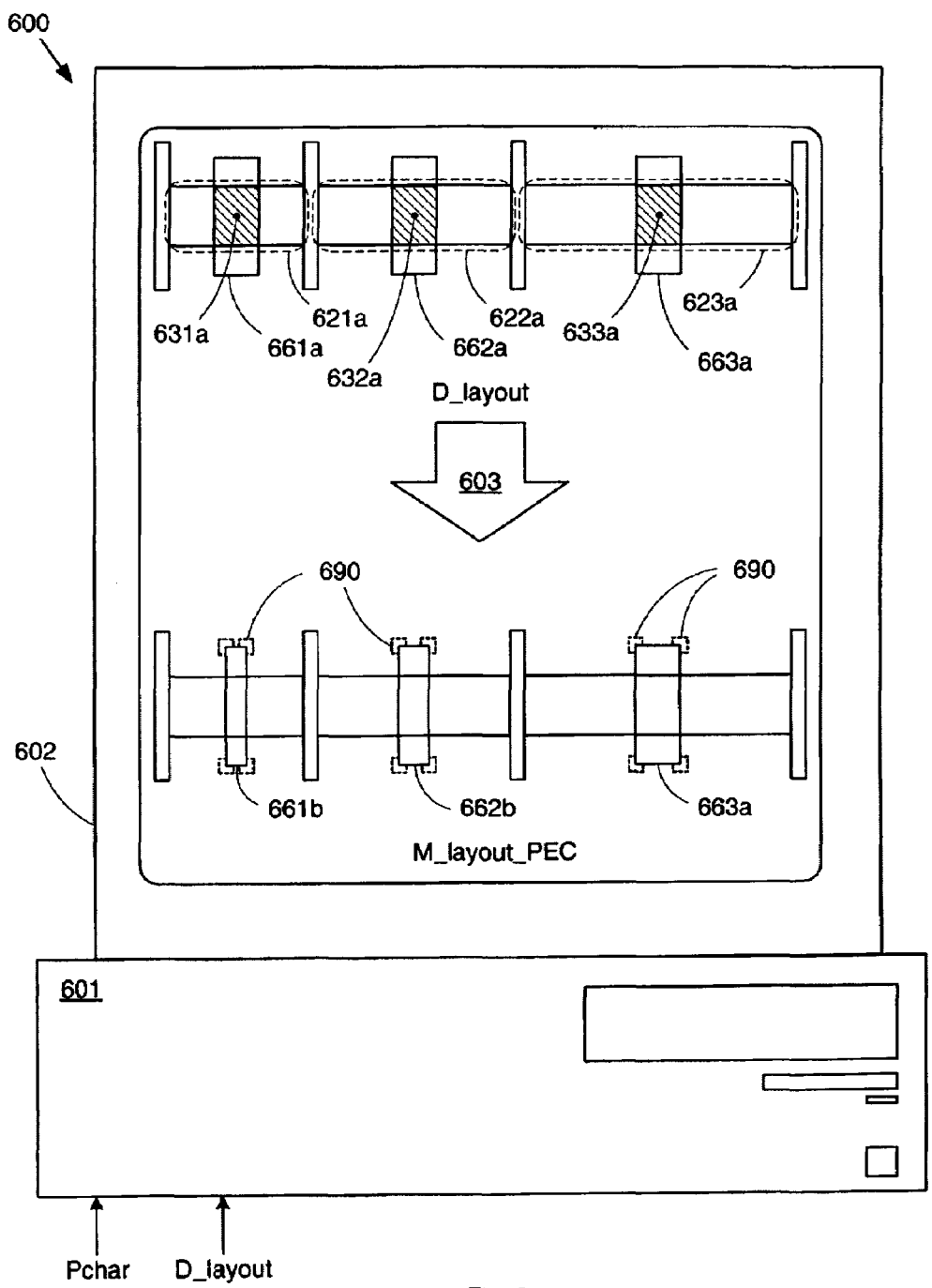
FIG. 6 is a system for performing physical effect compensation in accordance with an embodiment of the invention.

FIG. 6 shows a physical effect compensation system 600 according to an embodiment of the invention. System 600 includes a processing unit 601, such as a computer, for performing the physical effect compensation, and a monitor 602 for providing a graphical interface and/or output display for processing unit 601. Processing unit 601 is coupled to receive process characteristics Pchar for a selected process, and IC layout data files D_layout for the IC to be produced using the selected process. Processing unit 601 includes logic (e.g., software, configurable logic, preprogrammed read only memories (ROMs)) for using those inputs to generate compensated IC layout M_layout_PEC for the selected process, as described with respect to physical effect compensation step 561 in FIG. 5.

For example, to compensate for STI stress produced by the selected process that causes carrier mobility to decrease, a detection module in the logic of processing unit 601 can identify channel 631*a* (defined by gate 661*a* and active region 621*a*) and channel 632*a* (defined by gate 662*a* and active region 622*a*) specified in IC layout data files D_layout as being subject to STI stress (with channel 633*a* (defined by gate 633*a* and active region 623*a*) not being subject to STI stress). Gates 661*a* and 662*a* can then be dimensionally modified by a compensation module, indicated by arrow 603, to produce reduced-size gates 661b and 662b in compensated IC layout M_layout_PEC (while gate 663a remains unchanged). Note that since channels 631a and 632a are defined by gate and active layer elements, the detection module must be able to process multiple design layers. Note further that according to another embodiment of the invention, OPC features such as serifs 690 (and/or other OPC modifications, such as OPC bias for line width modification) can be added at the same time the physical effect compensation is applied to streamline the process further.

Although the present invention has been described in connection with several embodiments, it is understood that this invention is not limited to the embodiments disclosed, but is capable of various modifications that would be apparent to one of ordinary skill in the art. For example, while physical effect compensation is described with respect to STI stress for explanatory purposes, physical effect compensation can be applied in response to any type of process-related physical effect. Thus, the invention is limited only by the following claims and their equivalents.

What is claimed is:

1. A method for creating an integrated circuit (IC) layout for an IC to be created using a selected process, the method comprising:
   creating a physical layout for the IC, the physical layout comprising a plurality of layout elements;
   determining detailed characteristics for a physical effect of the selected process; and
   applying a dimensional modification to at least one of the plurality of layout elements to compensate for the physical effect, based on the detailed characteristics
   wherein the step of applying the dimensional modification adjusts the IC layout to generate a compensated IC layout.

2. The method of claim 1, wherein the physical effect comprises shallow trench isolation (STI) stress, wherein the plurality of layout elements includes a gate positioned between a first STI structure and a second STI structure, and wherein applying the dimensional modification to the at least one of the plurality of layout elements comprises adjusting a gate length of the gate.

3. The method of claim 2, wherein the STI stress increases carrier mobility, and wherein adjusting the gate length comprises increasing the gate length.

4. The method of claim 2, wherein the STI stress decreases carrier mobility, and wherein adjusting the gate length comprises decreasing the gate length.

5. The method of claim 2, wherein the gate is a first gate and wherein the gate length is a first gate length, the plurality of layout elements further including a second gate positioned between a third STI structure and a fourth STI structure, wherein applying the dimensional modification to the at least one of the plurality of layout elements comprises adjusting the first gate length of the first gate and a second gate length of the second gate into a first adjusted gate length and a second adjusted gate length, respectively.

6. The method of claim 5, wherein the first gate is spaced a first distance from the first STI structure, and wherein the second gate is spaced a second distance from the second STI structure, the first gate length being equal to the second gate length, the first distance being different from the second distance, and the first adjusted gate length being different from the second adjusted gate length.

7. The method of claim 5, wherein the first gate is spaced a first distance from the first STI structure, and wherein the second gate is spaced a second distance from the second STI structure, the first gate length being equal to the second gate length, the first distance being equal to the second distance, and the first adjusted gate length being equal to the second adjusted gate length.

8. The method of claim 1, wherein the physical layout comprises a plurality of design layers, and wherein the dimensional modification is based on at least two of the design layers.

9. The method of claim 1, further comprising performing optical proximity correction (OPC) to the plurality of layout elements.

10. The method of claim 9, wherein performing OPC is performed after applying the dimensional modification to the at least one of the plurality of layout elements.

11. The method of claim 9, wherein performing OPC is performed before applying the dimensional modification to the at least one of the plurality of layout elements.

12. The method of claim 9, wherein performing OPC is performed concurrently with applying the dimensional modification to the at least one of the plurality of layout elements.

13. The method of claim 1, wherein determining detailed characteristics for the physical effect comprises producing a test chip using the selected process.

14. A method for creating a mask set from a physical layout for an integrated circuit (IC), the physical layout comprising a plurality of layout elements, the mask set to be used with a selected process, the method comprising:
   determining detailed characteristics for a physical effect of the selected process from a test chip; and
   applying a dimensional modification to at least one of the plurality of layout elements to compensate for the physical effect, based on the detailed characteristics
   wherein the step of applying the dimensional modification comprises adjusting the physical layout to generate a compensated physical layout.

15. The method of claim 14, wherein the physical effect comprises shallow trench isolation (STI) stress, wherein the plurality of layout elements includes a gate positioned between a first STI structure and a second STI structure, and wherein applying the dimensional modification to the at least one of the plurality of layout elements comprises adjusting a gate length of the gate.

16. The method of claim 15, wherein the STI stress increases carrier mobility, and wherein adjusting the gate length comprises increasing the gate length.

17. The method of claim 15, wherein the STI stress decreases carrier mobility, and wherein adjusting the gate length comprises decreasing the gate length.

18. The method of claim 15, wherein the gate is a first gate and wherein the gate length is a first gate lengths, the first gate being spaced a first distance from the first STI structure, the plurality of layout elements further including a second gate positioned between a third STI structure and a fourth STI structure, the second gate being spaced a second distance from the third STI structure, the second distance being different from the first distance, wherein applying the dimensional modification to the at least one of the plurality of layout elements comprises adjusting the first gate length of the first gate and a second gate length of the second gate into a first adjusted gate length and a second adjusted gate length, respectively, the first gate length being equal to the second gate length, and the first adjusted gate length being different from the second adjusted gate length.

19. The method of claim 15, wherein the gate is a first gate and wherein the gate length is a first gate lengths, the first gate being spaced a first distance from the first STI structure, the plurality of layout elements further including a second gate positioned between a third STI structure and a fourth STI structure, the second gate being spaced a second distance from the third STI structure, the second distance being equal to the first distance, wherein applying the dimensional modification to the at least one of the plurality of layout elements comprises adjusting the first gate length of the first gate and a second gate length of the second gate into a first adjusted gate length and a second adjusted gate length, respectively, the first gate length being equal to the second gate length, and the first adjusted gate length being equal to the second adjusted gate length.

20. The method of claim 14, wherein the physical layout comprises a plurality of design layers, and wherein the dimensional modification is based on at least two of the design layers.

21. The method of claim 14, further comprising performing optical proximity correction (OPC) to the plurality of layout elements.

22. The method of claim 21, wherein performing OPC is performed after dimensionally modifying at least one of the plurality of layout elements.

23. The method of claim 21, wherein performing OPC is performed before dimensionally modifying at least one of the plurality of layout elements.

24. The method of claim 21, wherein performing OPC is performed concurrently with dimensionally modifying at least one of the plurality of layout elements.

25. A system for applying physical effect compensation to a physical layout for an IC, the system comprising:
 a detection module for identifying affected layout elements in the physical layout subject to a physical effect; and
 a compensation module for applying dimensional modifications to the affected layout elements to compensate for the physical effect
 wherein applying dimensional modifications to the affected layout elements comprises adjusting the physical layout to generate a compensated physical layout.

26. The system of claim 25, wherein the detection module and compensation module are part of an optical proximity correction (OPC) engine.

27. The system of claim 26, wherein the OPC engine comprises a rule-based engine.

28. The system of claim 25, wherein the physical layout comprises a plurality of design layers, and wherein the detection module comprises logic for concurrently processing multiple design layers to identify the affected layout elements.

* * * * *